United States Patent
Chang et al.

(10) Patent No.: US 10,784,334 B2
(45) Date of Patent: Sep. 22, 2020

(54) METHOD OF MANUFACTURING A CAPACITOR

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Funjian Province (CN)

( * ) Notice: Subject to any disclaimer, the term of this patent is extended or adjusted under 35 U.S.C. 154(b) by 0 days.

(21) Appl. No.: 16/129,782

(22) Filed: Sep. 12, 2018

(65) Prior Publication Data
US 2019/0123135 A1    Apr. 25, 2019

(30) Foreign Application Priority Data
Oct. 23, 2017    (CN) .......................... 2017 1 0991684

(51) Int. Cl.
*H01L 27/00*    (2006.01)
*H01L 49/02*    (2006.01)
*H01L 27/108*    (2006.01)

(52) U.S. Cl.
CPC .......... *H01L 28/88* (2013.01); *H01L 27/1085* (2013.01); *H01L 27/10852* (2013.01); *H01L 28/87* (2013.01)

(58) Field of Classification Search
None
See application file for complete search history.

(56) References Cited

U.S. PATENT DOCUMENTS

| | | | |
|---|---|---|---|
| 5,677,222 A | 10/1997 | Tseng |
| 6,211,079 B1 | 4/2001 | Jenq |
| 6,491,835 B1 | 12/2002 | Kumar |
| 6,559,025 B2 | 5/2003 | Kim |
| 7,915,736 B2 | 3/2011 | Kirby |
| 7,968,422 B2 | 6/2011 | Hautala |
| 8,049,327 B2 | 11/2011 | Kuo |
| 8,836,003 B2 | 9/2014 | Ervin |
| 8,866,209 B2 | 10/2014 | Tang |
| 9,362,422 B2 | 6/2016 | Lim |
| 2010/0133654 A1 | 6/2010 | Han |

(Continued)

FOREIGN PATENT DOCUMENTS

| | | |
|---|---|---|
| CN | 1381874 A | 11/2002 |
| CN | 102738226 A | 10/2012 |

(Continued)

*Primary Examiner* — Bradley Smith
(74) *Attorney, Agent, or Firm* — Winston Hsu (57) ABSTRACT

The present invention discloses a method of manufacturing a capacitor, which includes the steps of forming a capacitor recess in a sacrificial layer, wherein the sidewall of capacitor recess has a wave profile, forming a bottom electrode layer on the sidewall of capacitor recess, filling up the capacitor recess with a supporting layer, removing the sacrificial layer to forma capacitor pillar made up by the bottom electrode layer and the supporting layer, forming a capacitor dielectric layer on the capacitor pillar, and forming a top electrode layer on the capacitor dielectric layer.

10 Claims, 6 Drawing Sheets

(56) References Cited

U.S. PATENT DOCUMENTS

| | | | |
|---|---|---|---|
| 2015/0096589 A1 | 4/2015 | Lu | |
| 2015/0171159 A1* | 6/2015 | Lim | ................. H01L 27/10814 257/532 |
| 2016/0293441 A1 | 10/2016 | Lee | |
| 2018/0151666 A1* | 5/2018 | Yew | ........................ H01L 28/82 |

FOREIGN PATENT DOCUMENTS

| | | |
|---|---|---|
| CN | 103155098 A | 6/2013 |
| CN | 105448919 A | 3/2016 |

* cited by examiner

METHOD OF MANUFACTURING A CAPACITOR

BACKGROUND OF THE INVENTION

1. Field of the Invention

The present invention generally relates to a method of manufacturing a capacitor, and more specifically, to a method of manufacturing a pillar-type capacitor structure with wave profile.

2. Description of the Prior Art

A dynamic random access memory (DRAM) stores one bit of data using one transistor and one capacitor. Because the charge in the capacitor is lost over time, it must be periodically refreshed to maintain the contents stored in the memory, so it is called dynamic. The structure of DRAM is relatively simple, it uses only one transistor and one capacitor to store one bit of data, so its production cost is relatively low. In DRAM architecture, the capacitor is designed to be formed on the memory cell region and connected with the underlying transistor through a capacitor landing pad.

In the evolution of DRAM, the type of capacitor is progressed from early concave-type structure to cylinder-type structure that can provide larger plate area. When current semiconductor technology node is advanced to be smaller than 25 nm, the cylinder-type capacitor would easily suffer collapse issues during processing due to their congenital insufficiency in structural strength. In order to solve this issue, the type of capacitor structure is progressed to the pillar-type structure, in which supporting components are added into the structure to reinforce the structural strength of capacitor. However, although the pillar-type capacitor solves the collapse issue in prior art, its structural design would lose a large proportion of the plate area in the capacitor and, thereby, significantly lower the capacitance of capacitor. Accordingly, how to increase the plate area in pillar-type capacitor is currently an urgent topic in the development of DRAM in memory industry.

SUMMARY OF THE INVENTION

Given that the plate area of capacitor would be significantly decreased in current pillar type capacitor structure, a novel manufacturing method is therefore provided in the present invention, which features the formation of a sidewall with a wave profile to significantly increase the plate area and improve its capacitance.

The aspect of present invention is to provide a method of manufacturing a capacitor, which includes the steps of forming a capacitor recess in a sacrificial layer, wherein the sidewall of capacitor recess has a wave profile, forming a bottom electrode layer on the sidewall of capacitor recess, filling up the capacitor recess with a supporting layer after forming the bottom electrode layer, removing the sacrificial layer to form capacitor pillars made up by the bottom electrode layer and the supporting layer, forming a capacitor dielectric layer on the capacitor pillar, and forming a top electrode layer on the capacitor dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer. There may be various layer structures formed on the substrate. On the basis that no specific functions relevant to the invention are given, the term "substrate" would generalize for all those layer structures. In addition, the term "capacitor" used herein refers to a storage node in the architecture of dynamic random access memory (DRAM), and it may have different names in other electronic devices or memory architecture.

FIG. 1 to FIG. 11 are schematic cross-sections sequentially illustrating a manufacturing method of a capacitor structure in accordance with an embodiment of the present invention. The connection between components and layer structures are clearly shown and presented in the figures. First, please refer to FIG. 1. A semiconductor substrate 100 is prepared. The substrate 100 may be a silicon substrate, a silicon-on-insulator (SOI) substrate, a germanium substrate, a germanium-on-insulator substrate (GOI), or a silicon germanium substrate, or the like, with memory cell regions and peripheral regions defined thereon. Since the subject of present invention and the features disclosed in the embodiment do not relate to the peripheral region of memory device, all those features of peripheral region will not be described in the disclosure and shown in figures. Capacitor landing pads are formed in advance in the substrate 100 with materials like tungsten (W). Additionally, a conformal barrier layer (not shown), such as a titanium nitride (TiN) layer, may be formed surrounding the capacitor landing pads 102. The capacitor landing pad 102 would be further electrically connected to the underlying storage node contact plug and source/drain regions (not shown). A sacrificial layer 104, such as an amorphous silicon layer, is formed on the capacitor landing pad 102 to function as a molding layer for capacitor recesses. Using amorphous silicon to form the sacrificial layer 104 may facilitate the formation of silicon oxide layer on the layer surface in later process. A dielectric layer 106, such as a silicon nitride (SiN) layer or silicon carbonitride (SiCN) layer, may be further formed between the sacrificial layer 104, the capacitor landing pad 102 and the substrate 100 to function as a buffer layer or an etch stop layer.

In a normal manufacturing process of buried word lines in DRAM, word lines, bit lines, source/drain, and capacitor contact plugs are usually formed first in the substrate, and the capacitor landing pads 102 and capacitors (storage node) are then formed thereon in later processes. In the embodiment of present invention, since the flow of buried type memory process before the formation of capacitor landing pads is not the subject of the method and structure in present invention, no redundant detail relevant to those processes will be given in the disclosure to prevent obscuring the key points of the present invention.

Figure 1:
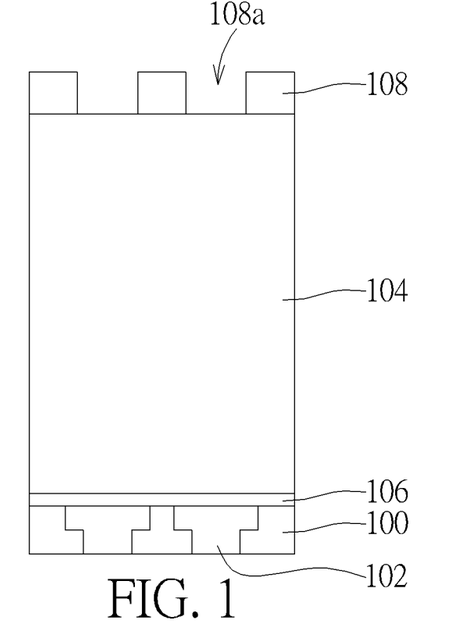
FIG. 1 to FIG. 11 are schematic cross-sections sequentially illustrating a method of manufacturing a capacitor structure in accordance with an embodiment of the present invention.

Still refer to FIG. 1. A mask layer 108 is formed on the sacrificial layer 104, such as a silicon oxide layer or silicon nitride layer formed by using thermal oxidation process or chemical vapor deposition (CVD) process. A photolithographic and etch process, such as a self-aligned double patterning (SADP), is performed to form recess pattern 108a in the mask layer 108, wherein the underlying sacrificial layer 104 is exposed and the positions of capacitor recess are defined on the substrate. Please note that, although there are only two recess patterns 108a shown in the figures, multiple recess patterns 108a may be formed and arranged on the substrate in array form in real process, wherein each recess pattern 108a would corresponds to a capacitor landing pad 102 and a storage node thereunder.

Figure 2:
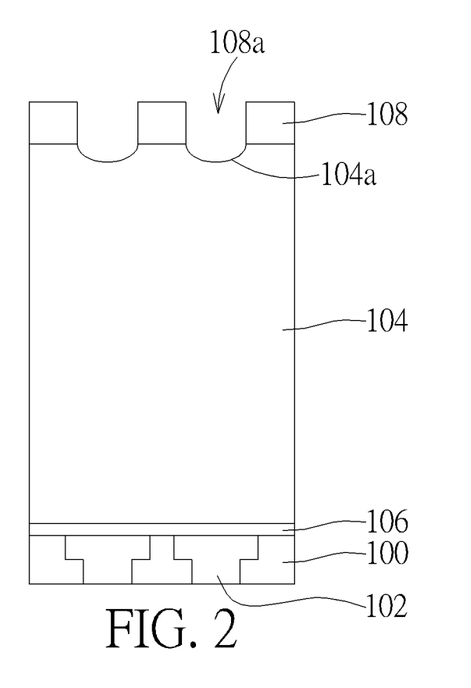

Please refer to FIG. 2. After the recess patters 108a are defined, the capacitor recesses are then formed in the subsequent process. An anisotropic etch process, such as a Bosch process using chlorine or bromine compound gas, is performed using the mask layer 108 as an etch mask to etch the exposed sacrificial layer 104, so as to form first holes 104a in the sacrificial layer 104. In the embodiment of present invention, the first hole 104 has a concaved bottom surface, wherein the depth of concaved bottom surface is merely a small proportion of the thickness of sacrificial layer 104. The first hole 104a may also slightly expand in lateral direction, so that its maximum width would be slightly larger than its opening width. This feature would contribute to form the capacitor with wave sidewall profile.

Figure 3:
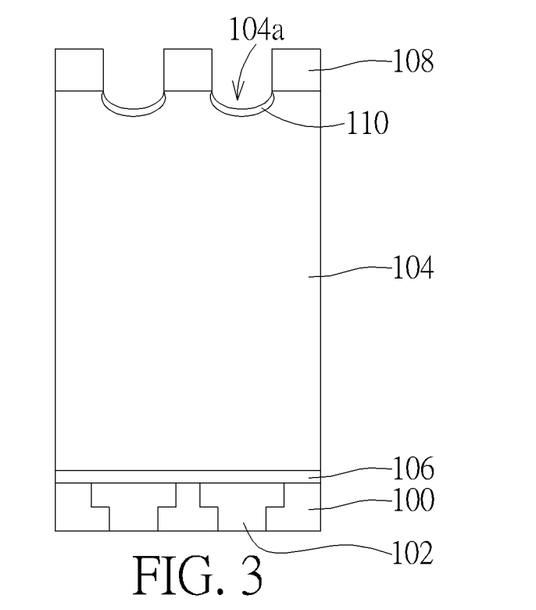

Please refer to FIG. 3. After the first hole 104a is formed, a passivation layer 110, such as a silicon oxide layer, is then formed on the exposed surface of sacrificial layer 104 in the first hole 104a. The passivation layer 110 may be formed by heating the amorphous silicon based sacrificial layer 104 in oxygen ambient to oxidize the exposed amorphous silicon surface.

Figure 4:
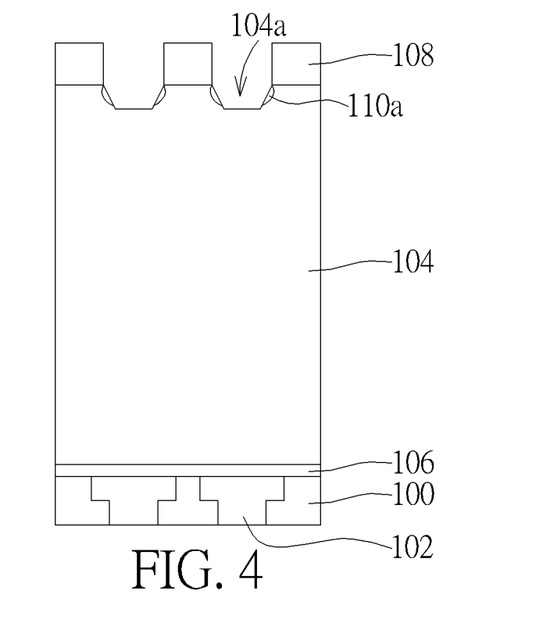

Please refer to FIG. 4. After the passivation layer 110 is formed, an anisotropic etch process using fluorochlorin gases may be performed to the exposed surface. As shown in FIG. 4, the anisotropic etch process would etch through the passivation layer 110 at bottom of the first hole 104a and expose the sacrificial layer 104 thereunder. A portion of the passivation layer 110a would remain on the sidewall of first hole 104a. In this way, the area of exposed sacrificial layer 104 would be smaller than the opening area of first hole 104a in a tapering form. In the embodiment of present invention, this process means to form the sidewall with a wave profile. The detail will be described hereafter in later embodiment.

Figure 5:
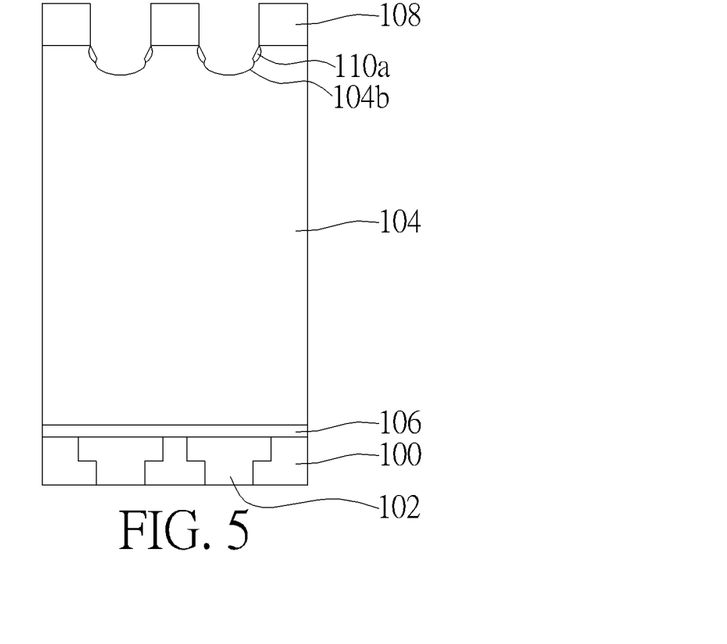
Figure 6:
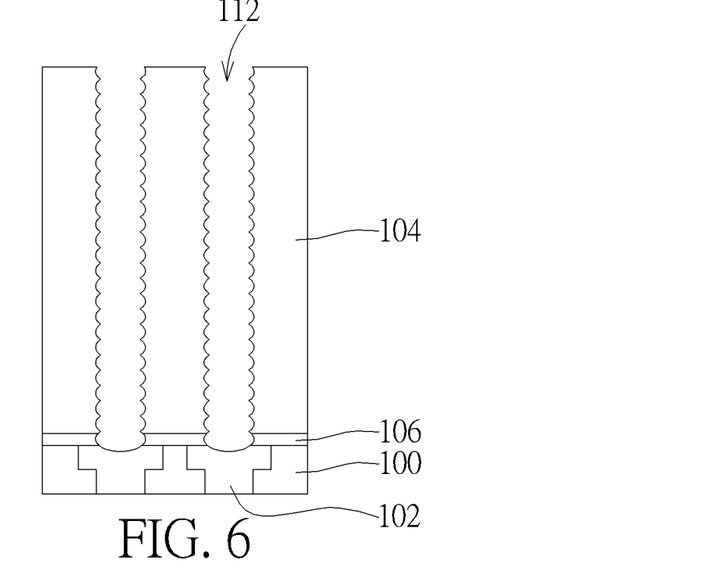

Please refer to FIG. 5. After the passivation layer 110 is etched through, another anisotropic etch process, such as the Bosch process using chlorine or bromine compound gas, is performed using the mask layer 108 as an etch mask to etch the exposed sacrificial layer 104 again, so as to form second holes 104b in the sacrificial layer 104. This step is substantially identical to the step shown in FIG. 2, with the difference being that the first hole 104a is formed from the surface of sacrificial layer 104, while the second hole 104b is formed from the bottom of first hole 104a. In this way, the lower second hole 104b would be connected to the upper first hole 104a. Further, since a portion of the passivation layer 110a would remain on the sidewall, those portions will not be etched during the etch process so as to form the sidewall in a wave form with continuous concaved profile.

The embodiment shown in FIGS. 3-5 discloses how to form the wave profile on the recess sidewall. Repeating the steps shown in FIGS. 3-5 may form a capacitor recess 112 with wave sidewall profile in the sacrificial layer 104 shown in FIG. 6, wherein the sidewall of capacitor recess 112 is made up by multiple first holes 104a (second holes 104b) connecting with each other from top to bottom. The capacitor recess 112 extends through the dielectric layer 106 and connects to the portion of capacitor landing pad 102. In the embodiment of present invention, the capacitor recess 112 may be formed in the same process chamber by multiple steps repeated in cycles. For example, the repeating the steps of above-mentioned anisotropic etch process using etch gases→thermal oxidation process in oxygen ambient→anisotropic etch process using etch gases. The more the number of cycles, the more concaved profiles may be formed on the recess sidewall. Each concaved waveform in the lateral direction may provide relatively larger inner area in comparison to a normal smooth sidewall, so that the plate area of capacitor structure may be significantly increased, and the issue of decreased plate area in the manufacture of pillar-type capacitor structure is, therefore, solved. The mask layer 108 and the passivation layer 110a remaining on the sidewall may be removed after the capacitor recess 112 is completely formed.

Figure 7:
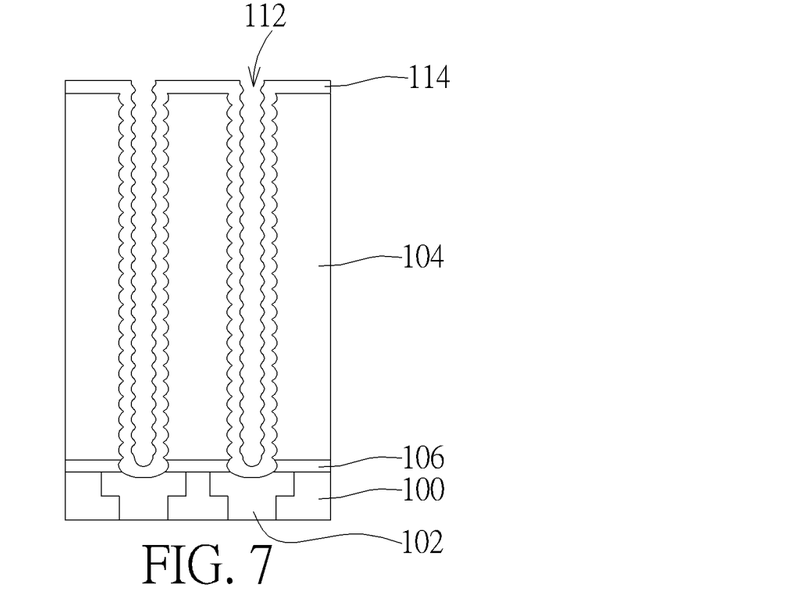

Please refer to FIG. 7. After the capacitor recess 12 is completed, the body of capacitor structure is then formed in the subsequent process. Every capacitor unit is made up by a bottom electrode layer, a capacitor dielectric layer and a top electrode layer. First, a conformal bottom electrode layer 114, such as a titanium nitride layer, may be conformally formed on the exposed surface of capacitor recess 112 by sequential flow deposition process, with a thickness about but not limited thereto 50 Å. The bottom electrode layer 114 may extend along the wave sidewall profile and connect to the portion of capacitor landing pad 102 in the substrate 100.

A portion of the bottom electrode layer 114 may be formed on the surface of sacrificial layer 104 outside the capacitor recess 112.

Figure 8:
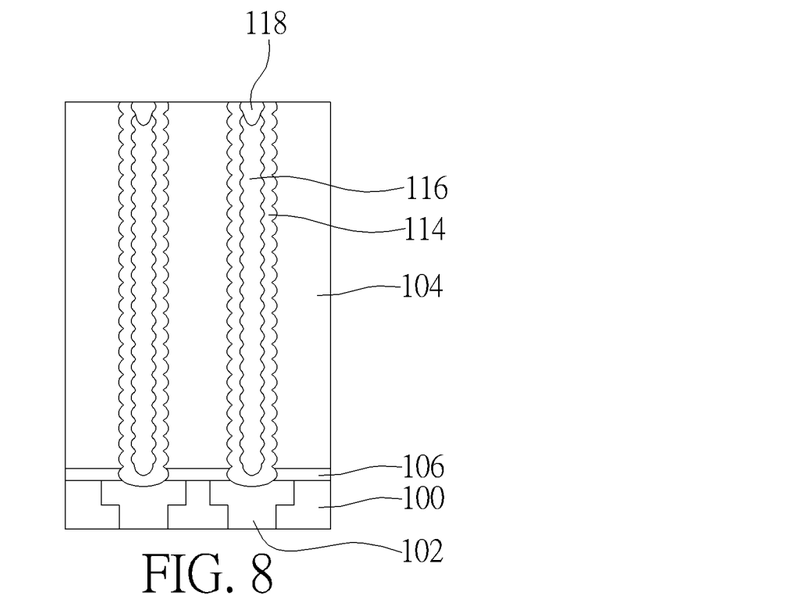

Please refer to FIG. 8. After the bottom electrode layer 114 is formed, the filling material, such as silicon oxide, is then filled into the capacitor recess 112 to form a supporting layer 116. The supporting layer 116 may be formed by CVD or other conventional deposition process. In the embodiment of present invention, the supporting layer 116 in the capacitor recess 112 may provide structural strength to the surrounding bottom electrode layer 114 to make the structure less easy to collapse in later processes. This is the essential feature of pillar-type capacitor. In the step of filling the supporting material, since the supporting material may also be formed concurrently on the bottom electrode layer 114 outside the capacitor recess 112, an etch back process may be subsequently performed to remove the supporting material and the bottom electrode layer 114 outside the capacitor recess 112, so that the supporting layer 116 may be formed only inside the capacitor recess 112. The etch back process may form a pit at the opening of capacitor recess 112. A capping layer 118, such as a silicon nitride layer, may be formed to fill the pit.

Figure 9:
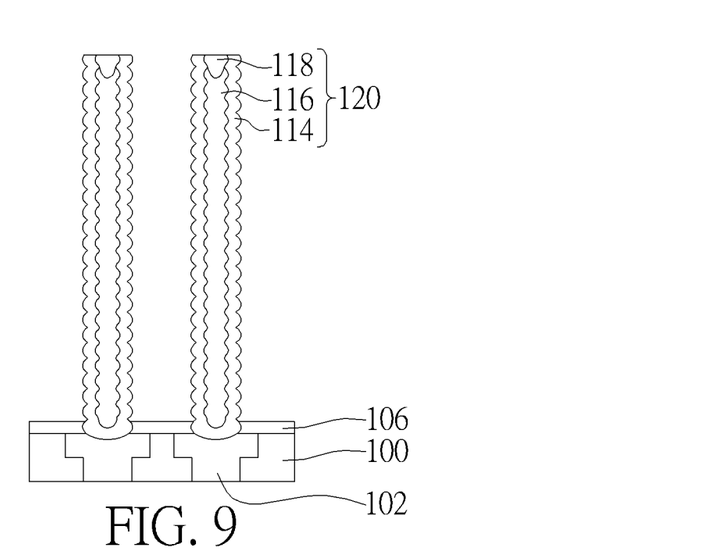

Please refer to FIG. 9. After the supporting layer 116 is filled, an etch process is then performed to remove the sacrificial layer 104, so as to form multiple capacitor pillars 120 towering on the substrate 100 and electrically connecting with the capacitor landing pad 102 thereunder. The silicon nitride based dielectric layer 106 may function as an etch stop layer in this step. Every capacitor pillar 120 is made up by the bottom electrode layer 114, the supporting layer 116 and the capping layer 118, etc. Since the supporting layer 116 is provided in the structure, the bottom electrode layer 114 will not easily collapse without the structural support of supporting layer 104, thus no other supporting structure like the one in prior art is required to separate adjacent capacitor units and provide structural strength. This is the advantage of the manufacturing method of pillar-type capacitor.

Figure 10:
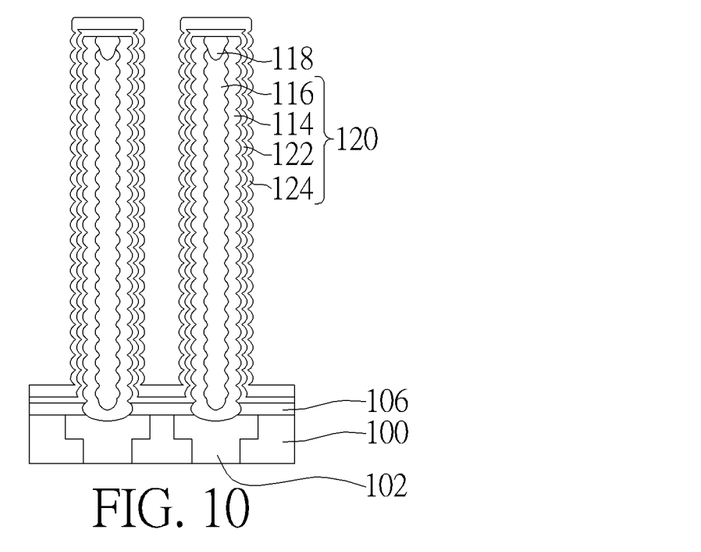

Please refer to FIG. 10. After the capacitor pillar 120 is formed, a capacitor dielectric layer 122 and a top electrode layer 124 are then subsequently formed on the surface of capacitor pillar 120. The capacitor dielectric layer 122 may be an alternating stack of zirconium oxide (ZrO) layers and aluminum oxide (Al$_2$O$_3$) layers, which may be conformally formed on the bottom electrode layer 114 by atomic layer deposition (ALD) process, with a thickness about but not limited thereto 65 Å. The manufacture of top electrode layer 124 is similar to the manufacture of top electrode layer 114. It may be conformally formed using the material like titanium nitride by Bosch process, with a thickness about but not limited thereto 50 Å. Please note that the capacitor dielectric layer 122 and the top electrode layer 124 on every capacitor pillar are continuous rather than isolated. The supporting layer 116, the bottom electrode layer 114, the capacitor dielectric layer 122 and the top electrode layer 124 constitute the capacitor structure 126.

Figure 11:
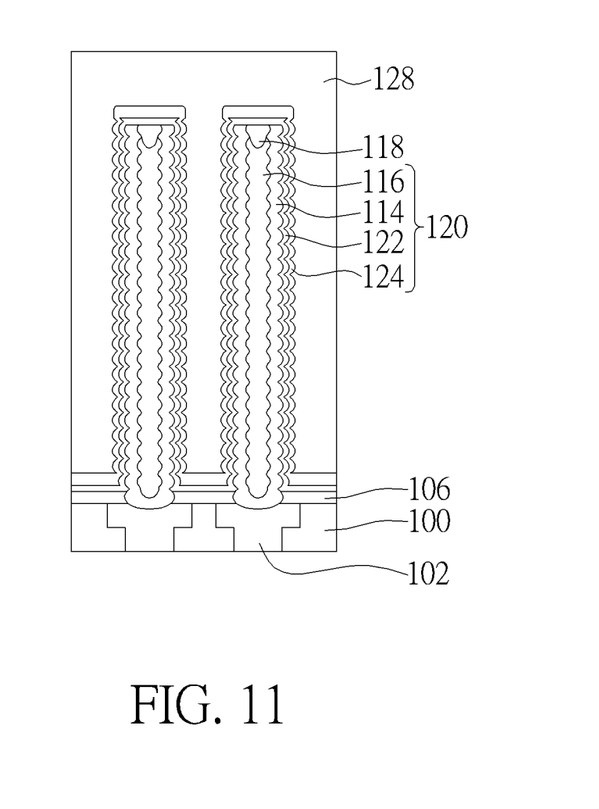

Please refer to FIG. 11. After the capacitor dielectric layer 122 and the top electrode layer 124 are formed, a conductive layer 128 is formed on the top electrode layer 124 to cover the capacitor structure 126 and the spaces therebetween. The material of conductive layer 128 may be silicon, silicon-germanium (SiGe), or silicon-phosphorus (SiP), etc, which may be formed on the surface of top electrode layer 124 of the capacitor structure 126 by using low-pressure chemical vapor deposition (LPCVD) process. The conductive layer 128 may be further doped with the elements like boron or phosphorus to improve its electrical performance.

After the conductive layer 128 is formed, a photolithographic and etch process may be performed to pattern the conductive layer 128 and the top electrode layer 124 on the capacitor structure 126 to form a top electrode plate and remove unnecessary conductive layer 128, top electrode layer 124 and capacitor dielectric layer 122 on the peripheral region. After the top electrode plate is formed, a pre-metal dielectric (PMD) layer is formed on the substrate 100 to cover the entire cell region (including the top electrode plate) and peripheral region. Since the present invention is focused on the process of manufacturing the capacitor structure 126, no redundant detail relevant to those later processes and the components formed in those processes will be given in the disclosure in case of obscuring the key points of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a capacitor, comprising:
providing a substrate, wherein a sacrificial layer is provided on said substrate and a material of said sacrificial layer is amorphous silicon;
forming a capacitor recess in said sacrificial layer, wherein a sidewall of said capacitor recess has a wave profile;
forming a bottom electrode layer on said sidewall of said capacitor recess;
after forming said bottom electrode layer, filling up said capacitor recess with a supporting layer;
removing said sacrificial layer to form a capacitor pillar made by said bottom electrode layer and said supporting layer;
forming a capacitor dielectric layer on said capacitor pillar; and
forming a top electrode layer on said capacitor dielectric layer.

2. The method of manufacturing a capacitor of claim 1, wherein the step of forming said capacitor recess comprises:
etching exposed said sacrificial layer to form a first hole;
forming a protection layer on a surface of said first hole;
etching through said protection layer at bottom of said first hole; and
repeating the above steps until multiple holes successively connecting with each other are formed so as to form said capacitor recess with said wave profile.

3. The method of manufacturing a capacitor of claim 1, further comprising forming a semiconductor layer on said top electrode layer after said top electrode layer is formed.

4. The method of manufacturing a capacitor of claim 3, wherein the material of said semiconductor layer is silicon-germanium.

5. The method of manufacturing a capacitor of claim 1, further comprising filling up the opening of said capacitor recess with a capping layer after said supporting layer is filled.

6. The method of manufacturing a capacitor of claim 5, wherein the material of said capping layer is silicon nitride.

7. The method of manufacturing a capacitor of claim 1, wherein the material of said bottom electrode layer is titanium nitride.

8. The method of manufacturing a capacitor of claim 1, wherein the material of said supporting layer is silicon nitride or tungsten.

9. The method of manufacturing a capacitor of claim 1, wherein said capacitor dielectric layer is an alternating stack of zirconium oxide layers and aluminum oxide layers.

10. The method of manufacturing a capacitor of claim 1, wherein the material of said top electrode layer is titanium nitride.

* * * * *

UNITED STATES PATENT AND TRADEMARK OFFICE
CERTIFICATE OF CORRECTION

PATENT NO. : 10,784,334 B2
APPLICATION NO. : 16/129782
DATED : September 22, 2020
INVENTOR(S) : Feng-Yi Chang et al.

Page 1 of 1

It is certified that error appears in the above-identified patent and that said Letters Patent is hereby corrected as shown below:

On the Title Page

Item (73), correct the address of the 2nd assignee, Fujian Jinhua Integrated Circuit Co., Ltd., from "Quanzhou, Funjian Province (CN)" to --Quanzhou, Fujian Province (CN)--.

Signed and Sealed this
Seventeenth Day of November, 2020

Andrei Iancu
*Director of the United States Patent and Trademark Office*